United States Patent
Jou et al.

(10) Patent No.: US 11,811,222 B2
(45) Date of Patent: Nov. 7, 2023

(54) ELECTROSTATIC DISCHARGE PROTECTION CIRCUIT

(71) Applicant: Vanguard International Semiconductor Corporation, Hsinchu (TW)

(72) Inventors: Yeh-Ning Jou, Hsinchu (TW); Chieh-Yao Chuang, Kaohsiung (TW); Hsien-Feng Liao, Taichung (TW); Ting-Yu Chang, Jhubei (TW); Chih-Hsuan Lin, Hsinchu (TW); Chang-Min Lin, Taichung (TW); Shao-Chang Huang, Hsinchu (TW); Ching-Ho Li, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 22 days.

(21) Appl. No.: 17/553,235

(22) Filed: Dec. 16, 2021

(65) Prior Publication Data

US 2023/0198250 A1 Jun. 22, 2023

(51) Int. Cl.
 *H02H 9/04* (2006.01)
(52) U.S. Cl.
 CPC .................. *H02H 9/046* (2013.01)
(58) Field of Classification Search
 CPC ........................................ H02H 9/046
 USPC ......................................... 361/56
 See application file for complete search history.

(56) References Cited

U.S. PATENT DOCUMENTS

| | | | | |
|---|---|---|---|---|
| 5,951,660 A | * | 9/1999 | Van Wonterghem | H02H 9/004 710/302 |
| 6,118,640 A | * | 9/2000 | Kwong | H02H 9/046 361/56 |
| 8,054,596 B2 | * | 11/2011 | Koyama | H01L 27/0251 361/118 |
| 8,508,892 B2 | * | 8/2013 | Gajanana | H02M 1/32 361/111 |

(Continued)

FOREIGN PATENT DOCUMENTS

| | | | | |
|---|---|---|---|---|
| DE | 102021101889 A1 | * | 8/2021 | ......... H01L 27/0255 |
| TW | 200731500 A | | 8/2007 | |

(Continued)

OTHER PUBLICATIONS

Lin, GengLi; There is a gap structure of high voltage electrostatic discharge protection device; Publication date: Jan. 23, 2008; Entire specification (Year: 2008).*

(Continued)

*Primary Examiner* — Dharti H Patel
(74) *Attorney, Agent, or Firm* — Birch, Stewart, Kolasch & Birch, LLP

(57) ABSTRACT

An electrostatic discharge (ESD) protection circuit including a detection circuit, a voltage-divider element, and a discharge element is provided. The detection circuit is coupled between a first power line and a second power line. In response to an ESD event, the detection circuit enables a turn-on signal. The voltage-divider element is coupled between the first power line and a third power line and receives the turn-on signal. The discharge element is coupled between the second and third power lines. In response to the turn-on signal being enabled, the first discharge element discharges an ESD current.

18 Claims, 5 Drawing Sheets

(56) References Cited

U.S. PATENT DOCUMENTS

| | | | |
|---|---|---|---|
| 9,679,891 B2* | 6/2017 | Dabral | H01L 27/0285 |
| 2007/0230073 A1* | 10/2007 | Ker | H01L 27/0285 |
| | | | 361/56 |
| 2014/0146426 A1* | 5/2014 | Murakami | G02F 1/136204 |
| | | | 361/56 |
| 2015/0214732 A1* | 7/2015 | Haruki | H02H 9/042 |
| | | | 361/56 |
| 2015/0270258 A1* | 9/2015 | Dabral | H02H 3/22 |
| | | | 361/56 |
| 2015/0333547 A1* | 11/2015 | Na | H02H 7/18 |
| | | | 361/93.1 |
| 2017/0214241 A1* | 7/2017 | Fan | H02H 9/046 |
| 2018/0026440 A1* | 1/2018 | Zhao | H02H 9/041 |
| | | | 361/56 |
| 2018/0287377 A1 | 10/2018 | Zou et al. | |
| 2019/0097420 A1* | 3/2019 | Chen | H01L 27/0285 |
| 2019/0341772 A1* | 11/2019 | Hsu | G01R 31/002 |
| 2020/0083705 A1* | 3/2020 | Xavier | H01L 27/0285 |
| 2021/0175707 A1* | 6/2021 | Chen | H03K 17/0822 |
| 2021/0226444 A1* | 7/2021 | Fang | H03K 17/0822 |
| 2021/0242677 A1 | 8/2021 | Langguth et al. | |

FOREIGN PATENT DOCUMENTS

| | | |
|---|---|---|
| TW | 200840016 A | 10/2008 |
| TW | 200929505 A | 7/2009 |
| TW | 201042748 A1 | 12/2010 |
| TW | 202105873 A | 2/2021 |

OTHER PUBLICATIONS

Taiwanese Office Action and Search Report for Taiwanese Application No. 110141984, dated Jul. 11, 2022.

* cited by examiner

__US 11,811,222 B2__

ELECTROSTATIC DISCHARGE PROTECTION CIRCUIT

BACKGROUND OF THE INVENTION

Field of the Invention

The invention relates to a protection circuit, and more particularly to an electrostatic discharge (ESD) protection circuit.

Description of the Related Art

As the semiconductor manufacturing process develops, electrostatic discharge (ESD) protection has become one of the most critical reliability issues for integrated circuits (IC). In particular, as the semiconductor manufacturing process advances into the deep sub-micron stage, scaled-down devices and thinner gate oxides are more vulnerable to ESD stress.

BRIEF SUMMARY OF THE INVENTION

In accordance with an embodiment of the disclosure, an electrostatic discharge (ESD) protection circuit comprises a detection circuit, a voltage-divider element, and a discharge element. The detection circuit is coupled between a first power line and a second power line. In response to an ESD event, the detection circuit enables a turn-on signal. The voltage-divider element is coupled between the first power line and a third power line and receives the turn-on signal. The discharge element is coupled between the second and third power lines. In response to the turn-on signal being enabled, the first discharge element discharges an ESD current.

In accordance with another embodiment of the disclosure, an ESD protection circuit comprises a detection circuit, a first transistor, and a second transistor. The detection circuit is coupled between a first power line and a second power line. In response to an ESD event, the detection circuit enables a turn-on signal. The first transistor comprises a first bulk, a first gate receiving the turn-on signal, a first drain coupled to a third power line, and a first source coupled to the second power line. The second transistor comprises a second bulk, a second gate receiving the turn-on signal, a second drain coupled to the third power line, and a second source coupled to the first power line. In response to the turn-on signal being enabled, the first and second transistors are turned on to discharge an ESD current. The junction voltage between the first drain and the first bulk is higher than the junction voltage between the first source and the first bulk. The junction voltage between the second drain and the second bulk is higher than the junction voltage between the second source and the second bulk.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
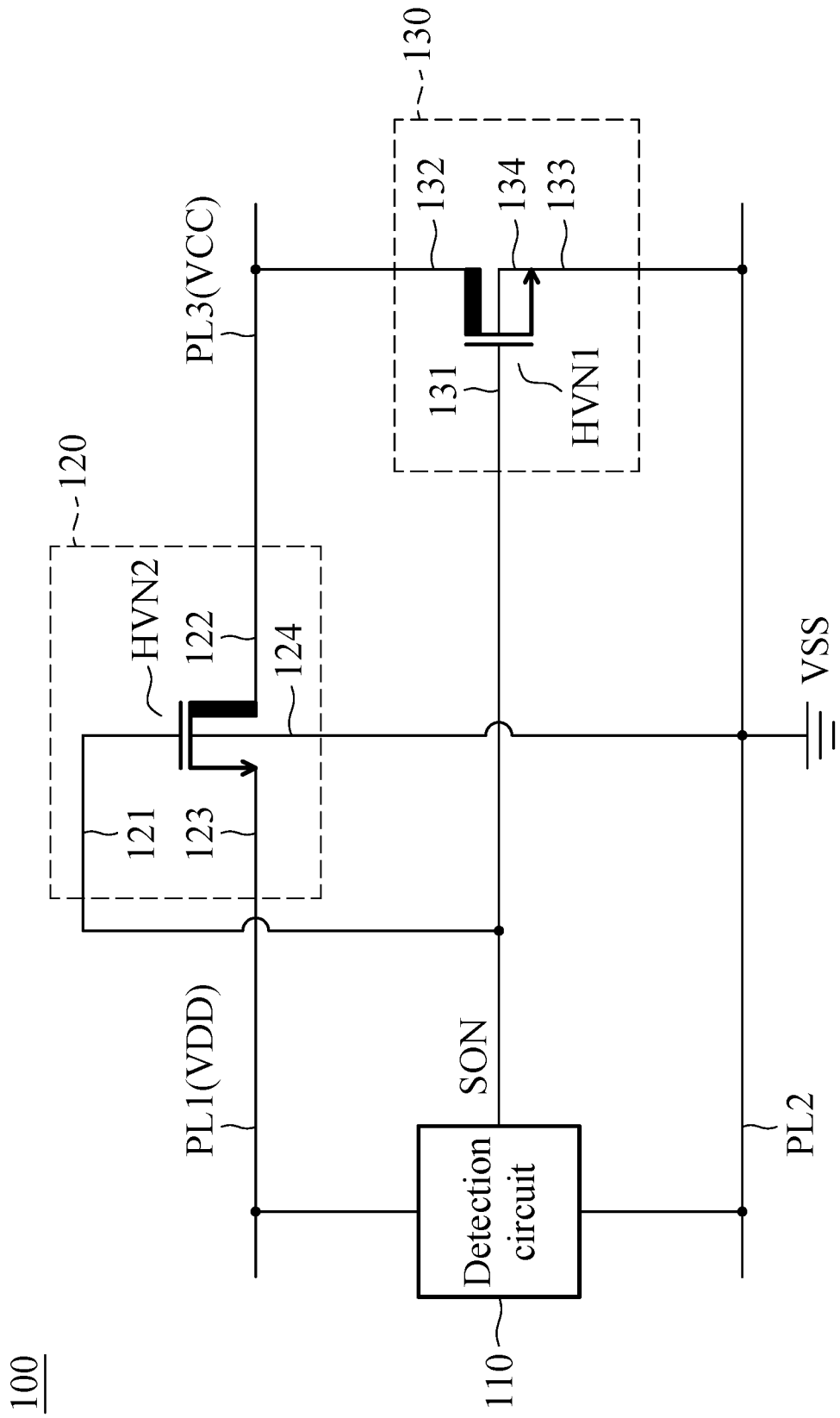
FIG. 1 is a schematic diagram of an exemplary embodiment of an electrostatic discharge (ESD) protection circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an electrostatic discharge (ESD) protection circuit according to various aspects of the present disclosure. The ESD protection circuit 100 comprises a detection circuit 110, a voltage-divider element 120, and a discharge element 130. The detection circuit 110 is coupled between power lines PL1 and PL2 and determines whether an ESD event occurs. When the ESD event occurs, the detection circuit 110 enables a turn-on signal SON. When no ESD event occurs, the detection circuit 110 does not enable the turn-on signal SON. In one embodiment, when there is no ESD event, the power line PL1 receives a low operation voltage VDD, and the power line PL2 receives a ground voltage VSS. In this case, the low operation voltage VDD is higher than the ground voltage VSS. In one embodiment, the low operation voltage VDD is about 5V, and the ground voltage VSS is about 0V.

The voltage-divider element 120 is coupled between the power lines PL1 and PL3 and receives the turn-on signal SON. In this embodiment, the voltage-divider element 120 is a bridge between the high operation voltage VCC and the low operation voltage VDD. For example, in a normal mode (no ESD event), the power line PL1 receives the low operation voltage VDD, and the power line PL3 receive the high operation voltage VCC. In one embodiment, the low operation voltage VDD is lower than the high operation voltage VCC. For example, the low operation voltage VDD is about 1.8V, 3.3V, or 5V, and the high operation voltage VCC is about 30V. Since the voltage-divider element 120 is a high-voltage element, the voltage-divider element 120 is capable of accepting the high operation voltage VCC.

In this embodiment, the voltage-divider element 120 is a high-voltage transistor HVN2. The gate 121 of the high-voltage transistor HVN2 receives the turn-on signal SON. The drain 122 of the high-voltage transistor HVN2 is coupled to the power line PL3. The source 123 of the high-voltage transistor HVN2 is coupled to the power line PL1. The bulk 124 of the high-voltage transistor HVN2 is coupled to the power line PL2.

The type of high-voltage transistor HVN2 is not limited in the present disclosure. In this embodiment, the high-voltage transistor HVN2 is an N-type transistor, but the disclosure is not limited thereto. In other embodiments, the high-voltage transistor HVN2 is a P-type transistor. In some embodiments, the junction voltage between the drain 122 and the bulk 124 of the high-voltage transistor HVN2 is higher than the junction voltage between the source 123 and the bulk 124 of the high-voltage transistor HVN2. In one embodiment, the drain 122 of the high-voltage transistor HVN2 is formed in a diffused region. Since the doped concentration of the diffused region is low, the drain 122 is capable of accepting the high voltage. In one embodiment, the high-voltage transistor HVN2 is a lateral diffused metal-oxide-semiconductor field-effect transistor (LDMOSFET) or a double diffused metal-oxide-semiconductor field-effect transistor (DDMOSFET).

The discharge element 130 is coupled between the power lines PL2 and PL3. When the turn-on signal SON is enabled, the discharge element 130 discharges an ESD current. In this embodiment, the discharge element 130 is a high-voltage transistor HVN1. The gate 131 of the high-voltage transistor HVN1 receives the turn-on signal SON. The drain 132 of the high-voltage transistor HVN1 is coupled to the power line PL3. The source 133 and the bulk 134 of the high-voltage transistor HVN1 are coupled to the power line PL2. The type of high-voltage transistor HVN1 is not limited in the present disclosure. In this embodiment, the high-voltage transistor HVN1 is an N-type transistor, but the disclosure is not limited thereto. In other embodiments, the high-voltage transistor HVN1 is a P-type transistor. In some embodiments, the junction voltage between the drain 132 and the bulk 134 of the high-voltage transistor HVN1 is higher than the junction voltage between the source 133 and the bulk 134 of the high-voltage transistor HVN1. In one embodiment, the high-voltage transistor HVN1 is a LDMOSFET or a DDMOSFET.

When an ESD event occurs in the power line PL3 and the power line PL1 is at a floating level, since the high-voltage transistor HVN2 does not be turned off completely, a portion of the ESD current flows from the power line PL3, through the high-voltage transistor HVN2 and to the detection circuit 110. At this time, the detection circuit 110 enables the turn-on signal SON. Therefore, the high-voltage transistor HVN1 is turned on. At this time, the majority ESD current passes from the power line PL3, through the high-voltage transistor HVN1, and to the power line PL2.

When there is no ESD event, the power line PL1 receives the low operation voltage VDD, the power line PL3 receives the high operation voltage VCC, and the power line PL2 receives the ground voltage VSS. At this time, the detection circuit 110 does not enable the turn-on signal SON. Therefore, the high-voltage transistors HVN1 and HVN2 are turned off. Since the high-voltage transistor HVN2 prevents the high operation voltage VCC from entering the detection circuit 110, the elements (e.g., transistors) in the detection circuit 110 do not be damaged by the high operation voltage VCC.

Figure 2:
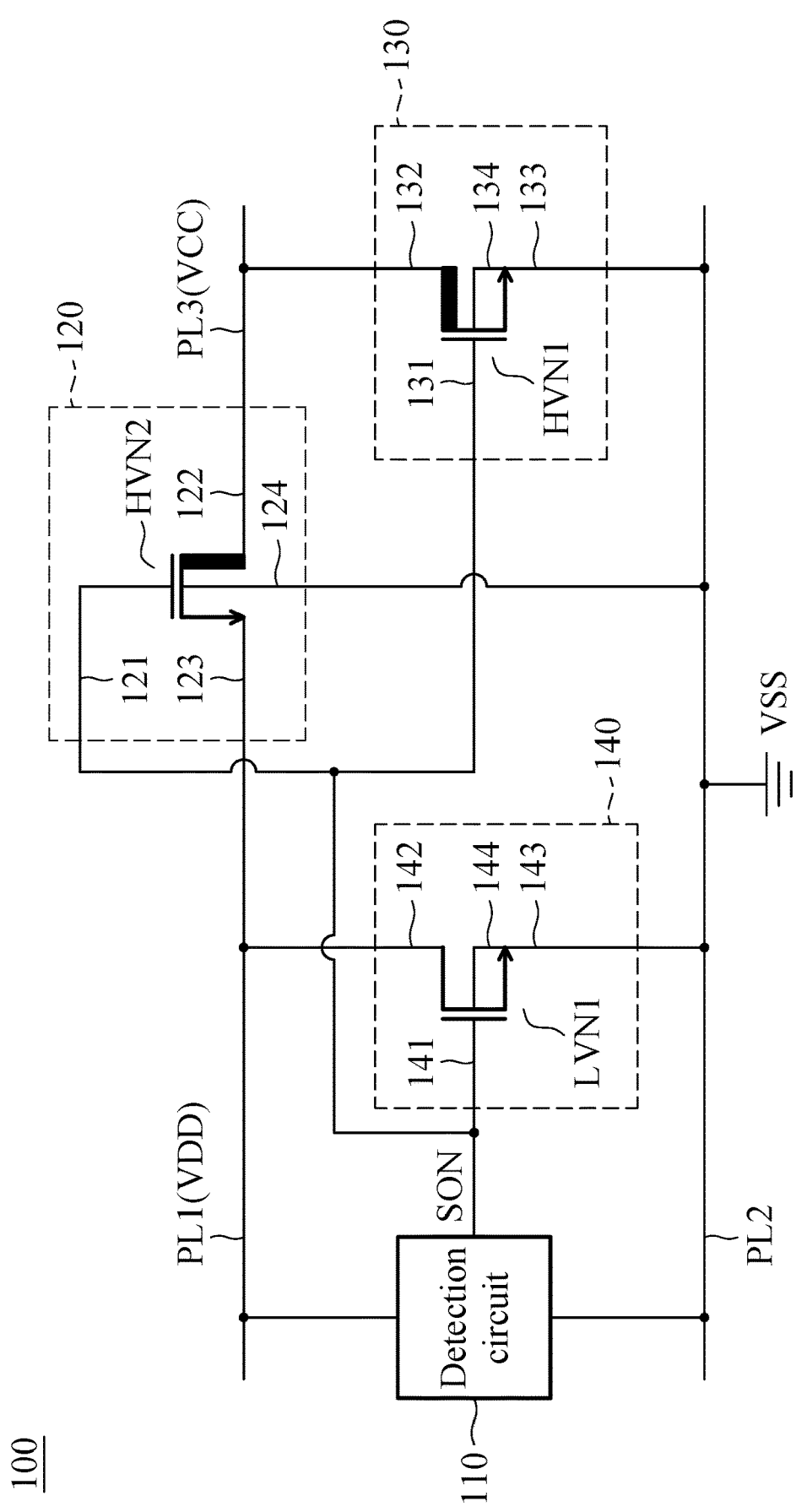
FIG. 2 is a schematic diagram of another exemplary embodiment of the ESD protection circuit according to various aspects of the present disclosure.

FIG. 2 is a schematic diagram of another exemplary embodiment of the ESD protection circuit according to various aspects of the present disclosure. FIG. 2 is similar to FIG. 1 except for the addition of a discharge element 140. The discharge element 140 is coupled between the power lines PL1 and PL2. When the turn-on signal SON is enabled, the discharge element 140 discharges an ESD current. In this embodiment, the discharge element 140 is a low-voltage transistor LVN1. The gate 141 of the low-voltage transistor LVN1 receives the turn-on signal SON. The drain 142 of the low-voltage transistor LVN1 is coupled to the power line PL1. The source 143 and the bulk 144 of the low-voltage transistor LVN1 are coupled to the power line PL2.

The type of low-voltage transistor LVN1 is not limited in the present disclosure. In this embodiment, the low-voltage transistor LVN1 is an N-type transistor, but the disclosure is not limited thereto. In other embodiments, the low-voltage transistor LVN1 is a P-type transistor. In some embodiments, the junction voltage between the drain 122 and the bulk 124 of the high-voltage transistor HVN2 is higher than the junction voltage between the drain 142 and the bulk 144 of the low-voltage transistor LVN1. In another embodiment, the junction voltage between the drain 132 and the bulk 134 of the high-voltage transistor HVN1 is also higher than the junction voltage between the drain 142 and the bulk 144 of the low-voltage transistor LVN1. In one embodiment, the drain 142 and the source 143 of the low-voltage transistor LVN1 are formed in the same well, e.g., a P-type well.

Figure 3:
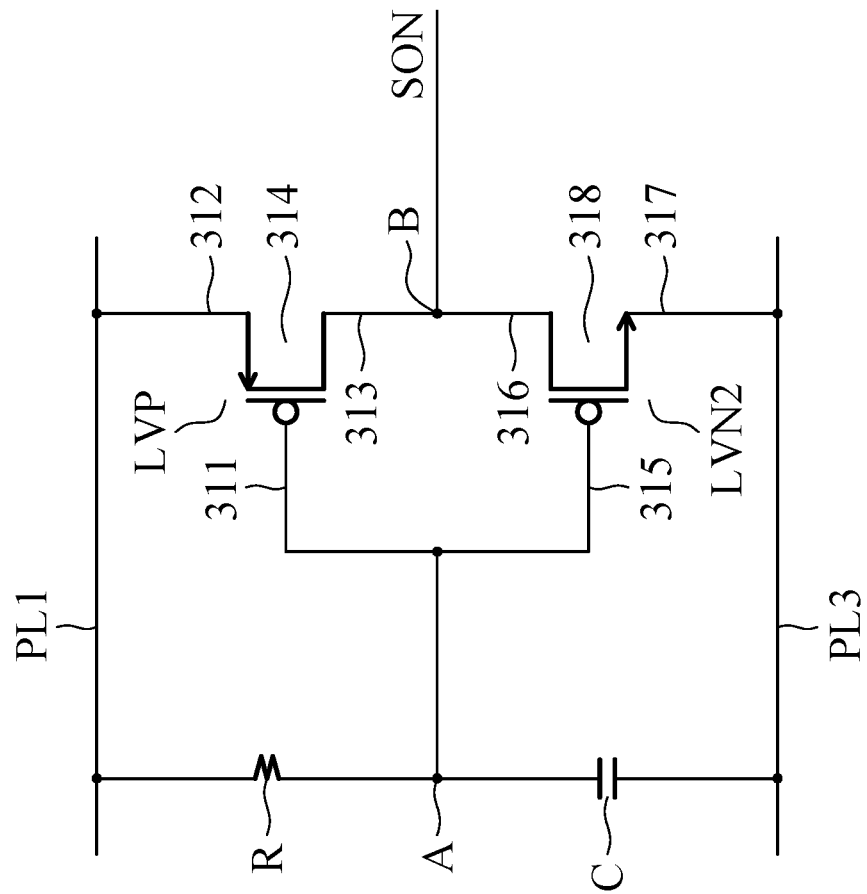
FIG. 3 is a schematic diagram of an exemplary embodiment of a detection circuit according to various aspects of the present disclosure.

FIG. 3 is a schematic diagram of an exemplary embodiment of a detection circuit according to various aspects of the present disclosure. The detection circuit 110 comprises a resistor R, a capacitor C, low-voltage transistors LVP and LVN2. The resistor R is coupled between the power line PL1 and the node A. The capacitor C is coupled between the node A and the power line PL2. In other embodiments, the capacitor C is a transistor. In this case, the gate of the transistor is coupled to the node A, and the drain, the source, and the bulk of the transistor are coupled to the power line PL2.

The gate 311 of the low-voltage transistor LVP is coupled to the node A. The source 312 of the low-voltage transistor LVP is coupled to the power line PL1. The drain 313 of the low-voltage transistor LVP is coupled to the node B. The gate 315 of the low-voltage transistor LVN2 is coupled to the node A. The source 317 of the low-voltage transistor LVN2 is coupled to the power line PL2. The drain 316 of the low-voltage transistor LVN2 is coupled to the node B. In this embodiment, the low-voltage transistors LVP and LVN2 are low-voltage transistors. In one embodiment, the low-voltage transistor LVP is a P-type transistor, and the low-voltage transistor LVN2 is an N-type transistor. In this case, the low-voltage transistors LVP and LVN2 constitute an inverter to invert the level of the node A. For example, when an ESD event occurs, the level of the node A is a low level. Therefore, the level of the node B is a high level. When no ESD event occurs, the level of the node A is a high level. Therefore, the level of the node B is a low level.

In this embodiment, the junction voltage between the source 312 and the bulk 314 of the low-voltage transistor LVP or the junction voltage between the drain 313 and the bulk 314 of the low-voltage transistor LVP is lower than the junction voltage between the drain 122 and the bulk 124 of the high-voltage transistor HVN2. In this case, the junction voltage between the source 312 and the bulk 314 of the low-voltage transistor LVP or the junction voltage between the drain 313 and the bulk 314 of the low-voltage transistor LVP is lower than the junction voltage between the drain 132 and the bulk 134 of the high-voltage transistor HVN1.

In another embodiment, the junction voltage between the drain 316 and the bulk 318 of the low-voltage transistor LVN2 and the junction voltage between the source 317 and the bulk 318 of the low-voltage transistor LVN2 are lower than the junction voltage between the drain 122 and the bulk 124 of the high-voltage transistor HVN2. In this case, the junction voltage between the drain 316 and the bulk 318 of the low-voltage transistor LVN2 and the junction voltage between the source 317 and the bulk 318 of the low-voltage transistor LVN2 are lower than the junction voltage between the drain 132 and the bulk 314 of the high-voltage transistor HVN1.

Figure 4:
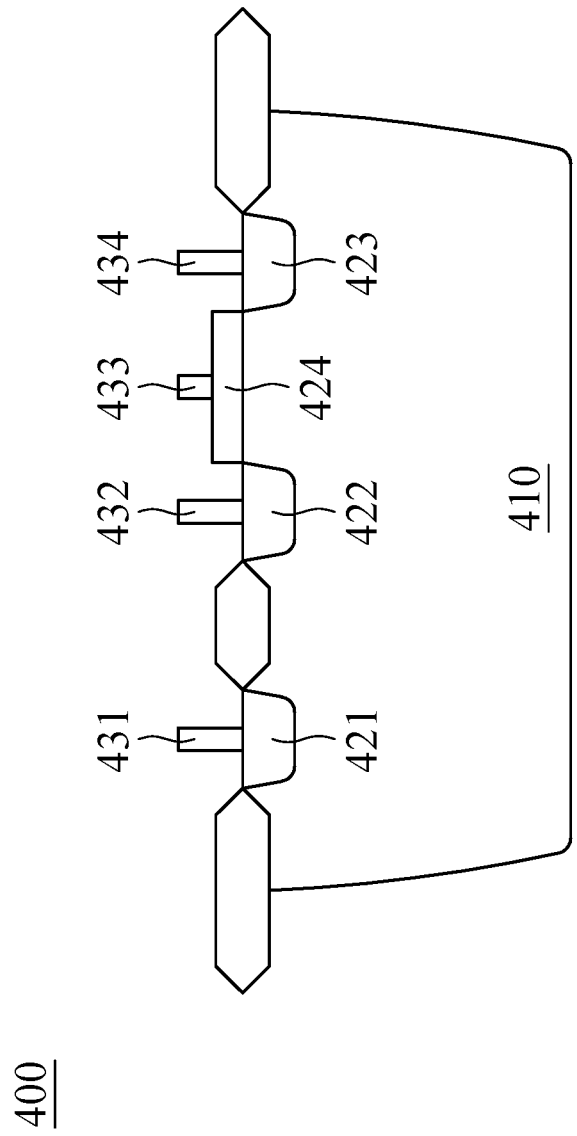
FIG. 4 is a schematic diagram of an exemplary embodiment of a low-voltage transistor according to various aspects of the present disclosure.

FIG. 4 is a schematic diagram of an exemplary embodiment of a low-voltage transistor according to various aspects of the present disclosure. The low-voltage transistor 400 comprises a well 410, doped regions 421~423, and a gate structure 424. The doped regions 421~423 are disposed in the well 410. In this embodiment, each of the well 410 and the doped region 421 has a first conductive type. The doped concentration of the doped region 421 is higher than the doped concentration of the well 410. Each of the doped regions 422 and 423 has a second conductive type. In this embodiment, the junction voltage between the doped 423 and the well 410 is similar to the junction voltage between the doped region 422 and the well 410. In one embodiment, the first conductive type is a P-type, and the second conductive type is N-type. The gate structure 424 is formed on the well 410.

In some embodiments, the doped region 421 is electrically connected to a bulk contact pad 431. The doped region 422 is electrically connected to a source contact pad 432. The gate structure 424 is electrically connected to a gate contact pad 433. The doped region 423 is electrically connected to a drain contact pad 434. In this case, the bulk contact pad 431 serves as the bulk of the transistor 400, the source contact pad 432 serves as the source of the transistor 400, the gate contact pad 433 serves as the gate of the transistor 400, and the drain contact pad 434 serves as a drain of the transistor 400.

Figure 5:
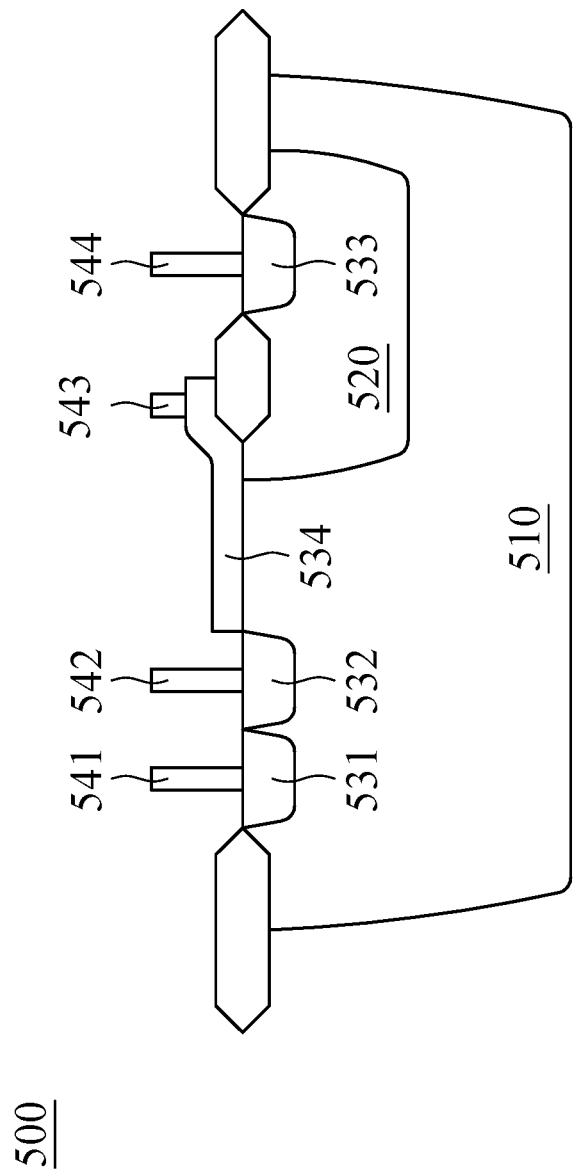
FIG. 5 is a schematic diagram of an exemplary embodiment of a high-voltage transistor according to various aspects of the present disclosure.

FIG. 5 is a schematic diagram of an exemplary embodiment of a high-voltage transistor according to various aspects of the present disclosure. The high-voltage transistor 500 comprises a well 510, a diffused region 520, doped regions 531~533, and a gate structure 534. The doped regions 531 and 532 are disposed in the well 510. In this embodiment, each of the well 510 and the doped region 531 has a first conductive type. The doped concentration of the doped region 531 is higher than the doped concentration of the well 510. The doped region 532 has a second conductive type. The second conductive type is opposite to the first conductive type. For example, when the first conductive type is a P-type, the second conductive type is N-type.

The diffused region 520 is disposed in the well 510. The doped region 533 is formed in the diffused region 520. Each of the diffused region 520 and the doped region 533 has the second conductive type. The doped concentration of the diffused region 520 is lower than the doped concentration of the doped region 533. In one embodiment, the diffused region 520 is a high-voltage N-type diffused region (HVNDD). In this embodiment, the junction voltage between the diffused region 520 and the well 510 is higher than the junction voltage between the doped region 532 and the well 510. In one embodiment, the junction voltage between the doped region 532 and the well 510 is similar to the junction voltage between the doped region 423 and the well 410 and the junction voltage between the doped region 422 and the well 410 of FIG. 4. In this embodiment, the gate structure 534 is formed on the well 510 and overlaps a portion of the diffused region 520.

In some embodiments, the doped region 531 is electrically connected to a bulk contact pad 541. The doped region 532 is electrically connected to a source contact pad 542. The gate structure 534 is electrically connected to a gate contact pad 543. The doped region 533 is electrically connected to a drain contact pad 544. In such cases, the bulk contact pad 541 serves as the bulk of the transistor 500, the source contact pad 542 serves as the source of the transistor 500, the gate contact pad 543 serves as the gate of the transistor 500, and the drain contact pad 544 serves as a drain of the transistor 500.

Since the diffused region 520 has a low doped concentration, the junction voltage between the doped region 533 and the bulk 510 is increased so that the doped region 533 can accept a high operation voltage, such as VCC. In FIG. 1, when the high-voltage transistor 500 serves as the voltage-divider element 120, the high-voltage transistor 500 can accept the high operation voltage VCC and avoid the high operation voltage VCC from damaging the elements in the detection circuit 110.

It will be understood that when an element or layer is referred to as being "on", "connected to" or "coupled to" another element or layer, it can be directly on, connected or coupled to the other element or layer or intervening elements or layers may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It should be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electrostatic discharge (ESD) protection circuit comprising:
   a detection circuit coupled between a first power line and a second power line, wherein in response to an ESD event, the detection circuit enables a turn-on signal;
   a voltage-divider element coupled between the first power line and a third power line and directly receiving the turn-on signal; and
   a first discharge element coupled between the second and third power lines, wherein in response to the turn-on signal being enabled, the first discharge element discharges an ESD current.

2. The ESD protection circuit as claimed in claim 1, wherein:
   in response to no ESD event occurring, the first power line receives a first voltage, the second power line receives a second voltage, and the third power line receives a third voltage, and
   the first voltage is higher than the second voltage, and the third voltage is higher than the first voltage.

3. The ESD protection circuit as claimed in claim 1, wherein:
   the first discharge element comprises a first transistor,
   a gate of the first transistor receives the turn-on signal, a drain of the first transistor is coupled to the third power line, and a source and a bulk of the first transistor are coupled to the second power line.

4. The ESD protection circuit as claimed in claim 3, wherein:
the voltage-divider element comprises a second transistor,
a gate of the second transistor receives the turn-on signal, the drain of the second transistor is coupled to the third power line, a source the second transistor is coupled to the first power line, and a bulk of the second transistor is coupled to the second power line.

5. The ESD protection circuit as claimed in claim 4, wherein the first transistor and the second transistor are lateral diffused metal-oxide-semiconductor field-effect transistors (LDMOSFETs).

6. The ESD protection circuit as claimed in claim 3, wherein the detection circuit comprises:
a resistor coupled between the first power line and a first node;
a capacitor coupled between the first node and the second power line;
a third transistor comprising a gate coupled to the first node, a source coupled to the first power line, and a drain coupled to a second node; and
a fourth transistor comprising a gate coupled to the first node, a source coupled to the second power line, and a drain coupled to the second node,
wherein a junction voltage between the drain and the bulk of the third transistor is less than a junction voltage between the drain and the bulk of the first transistor.

7. The ESD protection circuit as claimed in claim 1, further comprising:
a second discharge element coupled between the first and second power lines, wherein in response to the turn-on signal being enabled, the second discharge element discharges the ESD current.

8. The ESD protection circuit as claimed in claim 7, wherein:
the first discharge element comprises a first transistor, and the second discharge element comprises a second transistor,
a gate of the first transistor receives the turn-on signal, a drain of the first transistor is coupled to the third power line, a source and a bulk of the first transistor are coupled to the second power line, and
a gate of the second transistor receives the turn-on signal, a drain of the second transistor is coupled to the first power line, and a source and a bulk of the second transistor are coupled to the second power line.

9. The ESD protection circuit as claimed in claim 8, wherein a junction voltage between the drain and the bulk of the second transistor is less than a junction voltage between the drain and the bulk of the first transistor.

10. The ESD protection circuit as claimed in claim 1, wherein in response to the ESD event occurring on the third power line, a portion of the ESD current passes through the voltage-divider element and to the detection circuit so that the detection circuit enables the turn-on signal.

11. The ESD protection circuit as claimed in claim 1, wherein:
the voltage-divider element comprises a transistor,
a gate of the transistor directly receives the turn-on signal, and a drain of the transistor is directly connected to the third power line.

12. An ESD protection circuit, comprising:
a detection circuit coupled between a first power line and a second power line, wherein in response to an ESD event, the detection circuit enables a turn-on signal;
a first transistor comprising a first bulk, a first gate receiving the turn-on signal, a first drain coupled to a third power line, and a first source coupled to the second power line; and
a second transistor comprising a second bulk, a second gate directly receiving the turn-on signal, a second drain coupled to the third power line, and a second source coupled to the first power line,
wherein:
in response to the turn-on signal being enabled, the first and second transistors are turned on to discharge an ESD current,
the second drain is electrically connected to a first doped region, the second source is electrically connected to a second doped region,
the first doped region is disposed in a diffused region and the second doped region is outside of the diffused region, and
a doped concentration of the diffused region is lower than the doped concentration of the first doped region.

13. The ESD protection circuit as claimed in claim 12, further comprising:
a third transistor comprising a third bulk, a third gate receiving the turn-on signal, a third drain coupled to the first power line, and a third source coupled to the third bulk and the second power line,
wherein in response to the turn-on signal being enabled, the third transistor is turned on to discharge the ESD current.

14. The ESD protection circuit as claimed in claim 13, wherein a junction voltage between the first drain and the first bulk is higher than a junction voltage between the third drain and the third bulk, and a junction voltage between the second drain and the second bulk is higher than the junction voltage between the third drain and the third bulk.

15. The ESD protection circuit as claimed in claim 12, wherein the detection circuit comprises:
a resistor coupled between the first power line and a first node;
a capacitor coupled between the first node and the second power line;
a fourth transistor comprising a fourth bulk, a fourth gate coupled to the first node, a fourth drain coupled to a second node, and a fourth source coupled to the first power line; and
a fifth transistor comprising a fifth bulk, a fifth gate coupled to the first node, a fifth drain coupled to the second node, and a fifth source coupled to the second power line,
wherein:
a junction voltage between the first drain and the first bulk is higher than a junction voltage between the fourth drain and the fourth bulk, and
the junction voltage between the first drain and the first bulk is higher than a junction voltage between the fifth drain and the fifth bulk.

16. The ESD protection circuit as claimed in claim 15, wherein the first, second, third, and fifth transistors are N-type transistors, and the fourth transistor is a P-type transistor.

17. The ESD protection circuit as claimed in claim 12, wherein the second bulk is coupled to the second power line.

18. The ESD protection circuit as claimed in claim 12, wherein:
   in response to no ESD occurring, the first power line receives a first voltage, the second power line receives a second voltage, and the third power line receives a third voltage, and
   the first voltage is higher than the second voltage, and the third voltage is higher than the first voltage.

* * * * *